(12) United States Patent
Atamny et al.

(10) Patent No.: US 10,818,530 B1
(45) Date of Patent: Oct. 27, 2020

(54) SUBSTRATE CARRIERS WITH ISOLATION MEMBRANE

(71) Applicant: MURATA MACHINERY, LTD., Kyoto-fu (JP)

(72) Inventors: Fachri Atamny, Richterswil (CH); Gerhard Dovids, Grabs (CH); Yves Fenner, Berg (CH)

(73) Assignee: MURATA MACHINERY, LTD., Kyoto (JP)

( * ) Notice: Subject to any disclaimer, the term of this patent is extended or adjusted under 35 U.S.C. 154(b) by 100 days.

(21) Appl. No.: 16/117,239

(22) Filed: Aug. 30, 2018

Related U.S. Application Data

(60) Provisional application No. 62/551,877, filed on Aug. 30, 2017.

(51) Int. Cl.
*H01L 21/673* (2006.01)

(52) U.S. Cl.
CPC .. *H01L 21/67389* (2013.01); *H01L 21/67326* (2013.01); *H01L 21/67346* (2013.01)

(58) Field of Classification Search
CPC ............ H01L 21/67346; H01L 21/673; H01L 21/67389; H01L 21/67326; H01L 21/6875; H01L 21/67383; B65D 85/48
USPC .................................................. 206/710, 454
See application file for complete search history.

(56) References Cited

U.S. PATENT DOCUMENTS

| | | | | |
|---|---|---|---|---|
| 7,530,462 B2* | 5/2009 | Yajima | .............. | H01L 21/67346 206/303 |
| 7,854,327 B2* | 12/2010 | Hyobu | .............. | H01L 21/67294 206/454 |
| 8,403,143 B2* | 3/2013 | Chiu | ................. | H01L 21/67359 206/454 |
| 8,480,348 B2* | 7/2013 | Hyobu | .............. | H01L 21/67778 206/509 |
| 10,535,542 B2* | 1/2020 | Niederhofer | ...... | H01L 21/67386 |
| 2006/0283772 A1* | 12/2006 | Nishizaka | ......... | H01L 21/67353 206/723 |
| 2007/0284282 A1* | 12/2007 | Yajima | .............. | H01L 21/67346 206/710 |
| 2014/0079526 A1* | 3/2014 | Oyama | ................... | H01L 21/68 414/802 |
| 2016/0035787 A1* | 2/2016 | Matsuda | ........... | H01L 21/67346 438/68 |
| 2016/0086838 A1* | 3/2016 | Santos Rodriguez | ...................... | H01L 21/304 206/710 |
| 2018/0122674 A1* | 5/2018 | Dovids | ............. | H01L 21/67386 |
| 2018/0240696 A1* | 8/2018 | Yoo | ................... | C23C 16/45504 |

\* cited by examiner

*Primary Examiner* — Steven A. Reynolds
(74) *Attorney, Agent, or Firm* — Keating & Bennett, LLP

(57) ABSTRACT

Carrier, container or other system that provides a separation and protection for substrates, wafers, etc. for before, during or after processing or storage through the use of a membrane integral to the carrier or container respectively. This includes for use with Tec-Cell systems with high and low density configurations as well as other standardized systems, such as FOUPs. Includes protection for contamination brakeage chafing, through isolation and containment. Additional features are included such as the membrane providing guides or otherwise increasing efficiency or presence of airflow, such as laminar airflow over each substrate, wafer, etc. being held.

20 Claims, 11 Drawing Sheets

Providing a membrane or membranes between substrates or carriers or a group of substrates
1000

FIG. 10A

Providing a membrane or membranes between substrates or carriers or a group of substrates in a insert or recess in the carrier or holder
1001

Wherein a robot is able to remove the membrane and deliver the membrane to a cleaning or disposal station
1002

Replacing or returning a membrane to the membrane insert or recess in the carrier or holder
1003

FIG. 10B

SUBSTRATE CARRIERS WITH ISOLATION MEMBRANE

This application claims priority from provisional patent application Ser. No. 62/551,877 filed on Aug. 30, 2017, entitled Substrate Carriers with Isolation Membrane, which applications are incorporated herein by reference in their entirety for all purposes.

FIELD OF TECHNOLOGY

This disclosure relates generally to substrate storage and processing. In one example embodiment, to methods, apparatus, and systems for improved substrate storage and processing, wherein substrates are isolated and protected by an isolator or membrane.

BACKGROUND

Since the introduction of the 300 mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

Prior FOUPs generally serve to preserve wafers from the surrounding clean room environment. In conventional semiconductor projects, FOUPs allow wafers to enter the apparatus via a load port and front opening door. Often, robot handling mechanisms may place the wafers into the FOUP, where they are clamped in place by fins and held for later use. Yet FOUPs today are hampered by methods and system designs which may contaminate their contents, chafe wafers, and delay loading and unloading of substrate wafer contents as a result of multifarious construction. Thus, there may be a need for an invention that more efficiently and accurately accomplishes the desired tasks of FOUPs.

One inherent and common problem associated with the highly compact and space saving storage, processing and transferring of substrates in a stacked or any formation is that in the presence of contamination, breakage, chafing, or any other contamination events or substances, of which may happen to one or multiple wafers, may cause the rest of the wafers in the stack to become contaminated either through where the containments fall through the stack due to gravity, are carried by air or gas drafts, whether deliberate flows or not, or simply through proximity. Additionally, in some instances, complete breakage of a substrate may happen, wherein large pieces may fall or become loose, these pieces can contaminate, break or otherwise damage other substrates, as well as the machinery.

Airflow or gas flow within the systems is also largely important to provide for laminar flow over each substrates or groups of substrate for preservation, receive contamination and other reasons necessary for the proper storage, processing and transporting of substrates. As such, the direction and flow of substrates and the ability to direct the air or gas over each, is inherently important. Directing gas and air flow within tacks of substrates is difficult in that space and areas are limited, thus improvements in structures to efficiently and properly direct airflow is necessary and needs improvement specifically, at the individual substrate level, where laminar flow is highly important for the proper treatment, storage and processing of the substrates being held.

Thus, there is a need for a isolator membrane within the carriers, housing, or substrate storage, processing and transporting systems, methods and apparatuses which provide for a barrier for chafing, breakage, and pieces to each or groups of substrates as well as an increased efficiency and ability to direct air and gas to each individual substrate in a laminar fashion, wherein the gas or air is direct, laminar and clean and wherein reduces substrates contamination and other causes which would render the substrate unusable, such that higher quality and efficiency of the abilities and substrate manufacturing, processing and storage are realized within a compact system.

SUMMARY

Disclosed are methods, apparatus, and systems that may provide isolation and protection for substrates before, during or after storage, processing or storage. This ability may be included in compact and space saving structures such as in Tec-Cell carriers which may be in a high density formation or low density formation, or housings and storages such as FOUPs. Therein a holder such as a TecCell may provide a high-density formation of stacked wafers, wherein which may include an ability to stop the spread and contamination or ruining of substrates due to the presence of contamination, breakage, chafing, or any other contaminations.

This may be such that there is an inventive isolator, such as a membrane or isolator, sheet or structure of which may isolate each substrate and carrier or one or multiple wafers from one another, such as in a stack. Therein, if the one or other of the wafers and carriers in the stack becomes contaminated either through breakage or chafing, where the containments or pieces are then blocked from contaminating other wafers and carriers. Additionally, in some instances complete breakage of a substrate may happen, wherein large pieces may fall or become loose, wherein these pieces can contaminate, break or otherwise damage other substrates, as well as the machinery and wherein then the isolator or membrane stops the pieces from contamination. In other embodiments therein may be breakage, or simply chafing or smaller damage which causes dust or particulates to become airborne or fall or rise, which may contaminate the other substrates, such then the membrane or isolator may block these particulates.

The present invention then may provide a isolator within the carriers, housings, or substrates storage, processing and transporting systems, methods and apparatuses which provide for a barrier isolation for chafing, breakage, and pieces to each or groups of substrates as well as an increased efficiency and ability to direct air and gas to each individual substrate in a laminar fashion, wherein the gas or air is direct, laminar and clean and wherein reduces substrates contamination and other causes which would render the substrate unusable, such that higher quality and efficiency of the abilities and substrate manufacturing, processing and storage are realized within. It is noted that the substrates or wafers may be a product wafer or substrate, such as an incomplete or complete semiconductor device or element, or a processing substrate such as a reticle or any other processing element which may be transported, handled, held or stored.

The methods and systems disclosed herein may be implemented in any means for achieving various aspects. Other features will be apparent from the accompanying drawings and from the detailed description that follows.

BRIEF DESCRIPTION OF THE DRAWINGS

Example embodiments are illustrated by way of example and are not limited to the figures of the accompanying drawings, in which, like references indicate similar elements.

FIG. 10A is a flow chart diagram of an embodiment of the present invention membrane within a carrier or holder.

FIG. 10B is a flow chart diagram of an embodiment of the present invention membrane within a carrier or holder.

Figure 1:
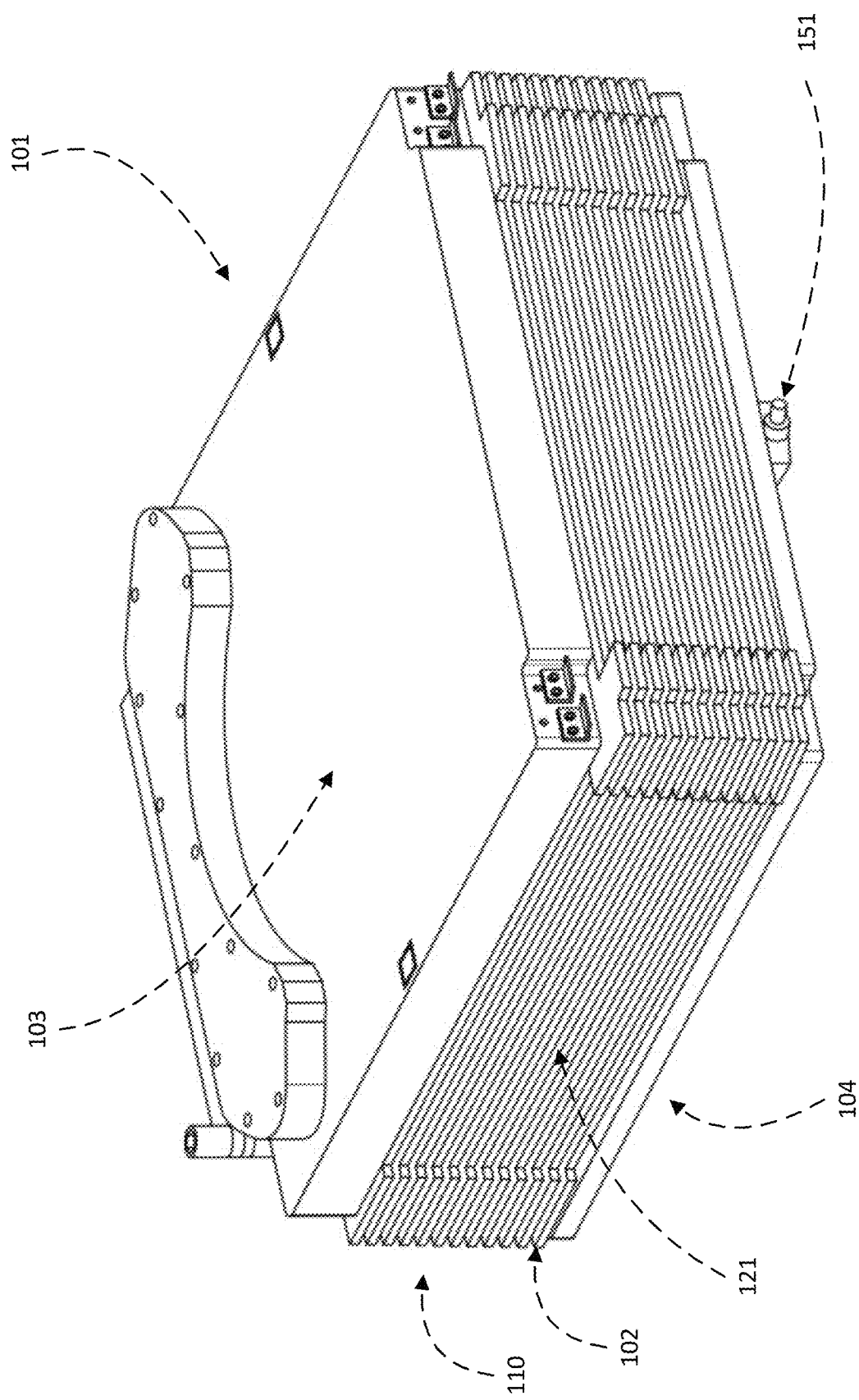
FIG. 1 may be a perspective view of one embodiment of the present invention substrate holder with multiple modules.

Other features of the present embodiments will be apparent from the accompanying drawings and from the detailed description that follows.

DETAILED DESCRIPTION

Disclosed are methods, apparatus, and systems that may provide separation and protection for substrates before, during or after storage, processing or storage.

In some embodiments, the present invention may provide a housing, carrier, or storage for substrates, wherein the substrates may be stacked. This may be also wherein, each substrate is placed or held on a single carrier, and wherein the substrates and carriers are then stacked. These stacks, may have a high density configuration, such that many carriers and substrates may be held efficiently. There may then be wherein a mode, via an opener, or other device, wherein then the substrate and carrier may be accessed by a robot or other system such to remove the carrier and substrate, or just the carrier, or just the substrate.

In some embodiments, such as in in high density configuration, or low density configuration the present invention may then provide a barrier between stacked substrates, carriers, or substrates and carriers.

In some embodiments, such as in in high density configuration, or low density configuration the present invention may then provide a barrier between stacks of substrates, carriers, or substrates and carriers.

In some embodiments, such as in in high density configuration, or low density configuration the present invention may then provide a barrier between individual substrates, carriers, or substrates and carriers.

It is noted that all embodiments may be wherein in a preferred embodiment the articles are high density configuration, but in other embodiments can be within a low density configuration or any other configuration or density.

In some embodiments, such as in in high density configuration, or low density configuration the present invention may then provide a barrier between individual substrates, carriers, or substrates and carriers.

In some embodiments, such as in in high density configuration, or low density configuration the present invention may then provide a barrier wherein the barrier is of the same structure of the carrier, ring, etc.

In some embodiments, such as in high density configuration, or low density configuration the present invention may then provide a barrier wherein the barrier is mounted or connected to the carrier, ring etc.

In some embodiments, such as in high density configuration, or low density configuration the present invention may then provide a barrier wherein the barrier is an insert.

In some embodiments, such as in in high density configuration, or low density configuration the present invention may then provide a barrier wherein the barrier is an insert, wherein the insert is placed onto the carrier, into the carrier or captive by the carrier.

In some embodiments, such as in in high density configuration, or low density configuration the present invention may then provide a barrier wherein the barrier is an insert, wherein the insert is placed, is captive or otherwise held within, on top or under the carrier holding structure wherein where the substrate is held.

In some embodiments, which may be combined with any other embodiment, the present invention may isolate a substrate from the substrate below or above, or adjacent in the stack.

In some embodiments, which may be combined with any other embodiment, the present invention may isolate a substrate and carrier from the substrate and carrier below or above, or adjacent in the stack.

In some embodiments, which may be combined with any other embodiment, the present invention may provide a barrier, wherein the barrier is a single piece with the carrier.

In some embodiments, which may be combined with any other embodiment, the present invention may provide a barrier, wherein the barrier is a single piece with the carrier, such as a monobloc structure.

In some embodiments, which may be combined with any other embodiment, the present invention may provide a barrier, wherein the barrier is formed in the same material as the carrier.

In some embodiments, which may be combined with any other embodiment, the present invention may provide a barrier, wherein the barrier is formed in the same production step as the carrier.

In some embodiments, which may be combined with any other embodiment, the present invention may provide a barrier, wherein the barrier is molded with the carrier.

In some embodiments, which may be combined with any other embodiment, the present invention may provide a barrier, wherein the barrier is attached or connected to the carrier.

In some embodiments, which may be combined with any other embodiment, the present invention may provide a barrier, wherein the barrier is removably attached or connected with the carrier.

In some embodiments, which may be combined with any other embodiment, the present invention may provide a barrier, wherein the barrier is permanently attached or connected with the carrier.

In some embodiments, which may be combined with any other embodiment, the present invention may provide a barrier, wherein the barrier is semi-permanently attached or connected with the carrier.

In some embodiments, which may be combined with any other embodiment, the present invention may provide the ability to provide in compact and space saving formations such as in Tec-Cell carriers, housings and storages, wherein in a high-density stacked formation may include an ability to stop the spread and ruining of substrates due to the presence of contamination, breakage, chafing, or any other contaminations.

In some embodiments, which may be combined with any other embodiment, the present invention may provide the ability to wherein the inventive membrane or isolator material, sheet or structure of which may isolate each substrate and carrier, or one or multiple wafers from one another, wherein if the one or other of the wafers and carriers in the stack become contaminated either through breakage or chafing, where the containments or pieces are then blocked from contaminating other wafers and carriers. Additionally in some instances complete breakage of a substrate may happen, wherein large pieces may fall or become loose, these pieces can contaminate, break or otherwise damage other substrates, as well as the machinery and wherein then the isolator or membrane stops the pieces from contamination.

In some embodiments, which may be combined with any other embodiment, therein may be breakage, or simply chafing or smaller damage which causes dust or particulates to become airborne or fall or rise, which may contaminate the other substrates, such then the membrane or isolator may block these particulates.

In some embodiments, which may be combined with any other embodiment, the present invention may provide the ability to, wherein the membrane or isolator may then also provide an ability to direct airflow or gas flow.

In some embodiments, which may be combined with any other embodiment, the present invention may provide the ability to wherein the membrane or isolator may then also provide an ability to direct airflow or gas flow such that there is laminar flow over each substrates or groups of substrate for preservation, receive contamination and other reasons necessary for the proper storage, processing and transporting of the present invention then may provide improvements in structures to efficiently and properly direct airflow is necessary and needs improvement specifically, at the individual substrate level, where laminar flow is highly important for the proper treatment, storage and processing of the substrates being held.

The present invention then may provide an isolator within the carriers, housings, or substrates storage wherein the isolate, along with the carrier structure may provide indents, recesses, volumes, blades, or otherwise structures that guide air flow over, at, or away from the substrates for a function.

The present invention then may provide a isolator within the carriers, housings, or substrates storage wherein the isolate, along with the carrier structure may provide wherein the function for guiding the air flow is a laminar flow at the substrates, such that the air flow is able to provide an ability to decontaminate, keep from contaminate or provide any other processing, storage or other need for the substrates.

The present invention then may provide a isolator within the carriers, housings, or substrates storage, processing and transporting systems, methods and apparatuses which provide for a barrier isolation for chafing, breakage, and pieces to each or groups of substrates as well as an increased efficiency and ability to direct air and gas to each individual substrate in a laminar fashion, wherein the gas or air is direct, laminar and clean and wherein reduces substrates contamination and other causes which would render the substrate unusable, such that higher quality and efficiency of the abilities and substrate manufacturing, processing and storage are realized within.

It is noted that the membrane or isolator may be made of any material, such as the same material as the carrier, structure etc. The material used for the membrane may provide a particular property of function depending on the embodiment. For instance a material, such as a plastic or metal or alloy may be chosen for a particular resistance to chafing and material buildup, or another material may be chosen due to cost or production requirements, such as molds, sizing, or time requirements. In other embodiments the membrane may be made of materials which provide a function just as hydrophobic, hydrophilic or for instance non-stick coatings or polymers which may reduce contamination buildup, and provide clean pathways for laminar airflow and removal of contaminants. It is also noted that in some instances the membranes may be made of a sticky surface such that contamination and breakage, for instance particulates and pieces may stick to the membrane such that the debris and contamination is not spread by gravity, air flow or otherwise.

It is noted that the membranes may be easily removable by human, robot or otherwise such as a process for replacement or cleaning. In some embodiments, the membranes include their own particular insert or recess for removal or easy of removal, and in other embodiments may be present instead or be placed in substrate holders, such that they may protect then the above and below substrates, and such that the standard substrate arm and robot may be able or remove or move the membrane such that the same supply chain or robot chain that moves carriers and substrates can remove membranes. In other embodiments, these same or different robots can remove the membranes from dedicated membrane insert areas, or any other combinations.

It is noted that in some embodiments, the present invention may be provided wherein as described, the carriers and holders are high and low density able substrate carriers and holders, but in other embodiments the membranes and carriers and holders may be within FOUPs or other carrier and holder designs, such as wherein there are no individual carriers, but a single structure with stacked substrates in the single carrier. In these instances the membranes may then be for instance, captive to the structure, inserted into the structure, held in place on substrates on some of the carrier arms, or otherwise provided within the structure.

It is noted that in some embodiments, laminar air flow is not required, needed or desired and as such that carrier, membrane, or any other air flow directors or structures may provide such that the air flows through, to or from a particular area or volume, or for instance creates turbulences such as for a function such as cleaning or providing reduced contamination or ability for contamination to build up in a particular area or volume.

This includes film separation both between individual substrates or rings, and between stacks or groups etc. Also, there may be membranes between and where the thin wafer is mounted and where the wafer may or may not be mounted. Breakage solutions include, for instance, where the membrane and structures and surfaces are designed to manage and help the flow of gases, and the flow of particles or contaminants (such as by the flow of gas), especially in the case of breakage or contamination. Additional embodiments will include nanotech coating and membrane structure for particle and contamination capture e.g. of AMC's. Also will provide solutions for thin wafer transportation and storage for chucked wafers or other contaminated wafers.

In a preferred embodiment the invention provides a substrate manufacturing, processing or transfer system, wherein includes at least a substrate handling system made of one or more holders, wherein the holders are stackable and may have one or more holding arms that extend into a center interior recess of the holder such that that the holder hold a substrate via the holding arms. Additionally the arms may hold one substrate each, such that there is a separation between each substrate when the holders are stacked. In some embodiments, the holders are formed form one piece of material and can be made in one forming process. In a preferred embodiments, the present invention may provide that the holders have one or more isolation structures, wherein a holder and a held substrate are isolated from an above or below holder and held substrate in a stack. In a preferred embodiment these isolation structures may reduce contamination between disparate stacked holders and substrates, including wherein the isolation structures impede contamination from broken or chaffing substrates or holders. In some embodiments the isolation structures are a membrane, wherein the membrane is permeable to gas, but not to debris or dust. In some embodiments, the isolation structures may include guides, wherein the guides guide a gas such that the gas is provided to the substrates in a laminar flow. Additionally, the guides may guide a gas such that the gas is directed from one or more gas inlets in the holder, over the substrates in a laminar flow, to one or more other gas outlets in the holder.

In a preferred embodiment, the isolation structure or membrane is made in the same production step as the holder and can be made of the same material as the holder.

In a preferred embodiment the substrates held by the holders may not be clamped or have pressure exerted by the holders on the substrates such as to reduce damage to the substrates.

In a preferred embodiment, the holding arms may be four arms on each diagonal side of a square substrate holder and may be such that the holding arms have an angled arch design with a notch on the inward side of the arch, wherein the notch angles downward in relation to the substrate. It is noted that the angled arms may position the contact patch to be on the extreme end of the substrate.

In a preferred embodiment the isolation structure may be configured such that the isolation structure fully spans the interior space of the holder, such that all of the area immediately below the substrate being held is isolated from the volume below.

In a preferred embodiment the isolation structure may be configured such that the isolation structure only partially spans the interior space of the holder, such that most of the area immediately below the substrate being held is isolated from the volume below.

In a preferred embodiment the isolation structure may be configured such that the isolation structure is configured in a plane with the bottom edge of the holder, such that the isolation structure spans the interior of the holder, below the substrate held by the holder, but above a corresponding substrate and holder below when stacked.

In a preferred embodiment the isolation structure may be configured such that the isolation structure is configured in a plane with the bottom edge of the holder arm, such that the isolation structure spans the entire interior of the holder, below the substrate held by the holder, but above a corresponding substrate and holder below when stacked.

In a preferred embodiment the isolation structure may be configured such that the isolation structure is configured in a plane with the bottom edge of the holder arm, such that the isolation structure spans the interior space of the arms, such that the isolation structure is below only the substrate, and arms being held, and above a corresponding substrate and holder below when stacked.

In a preferred embodiment the isolation structure may be configured such that the isolation structure is configured in a plane along the interior edge of the holder arm, such that the isolation structure spans the interior space of the arms, such that the isolation structure is below only the substrate, and arms being held, and above a corresponding substrate and holder below when stacked. Additionally, the isolation structure may be configured in a plane on the top edge of the holder arm, such that the isolation structure spans the interior space of the arms, such that the isolation structure is below only the substrate, and arms being held, and above a corresponding substrate and holder below when stacked. This may be wherein the isolation structure is configured such that the contact point of the substrate to the holder is above the isolation structure, such that the isolation structure and substrate do not touch.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods are industry terms and may refer to similar alternatives In addition, the components shown in the figures, their connections, couples, and relationships, and their functions, are meant to be exemplary only, and are not meant to limit the embodiments described herein.

FIG. 1 may be a perspective view of one embodiment of the present invention substrate holder with multiple modules.

FIG. 1 teaches to a substrate holder 101. The substrate holder may be made of at least one disparate modules, such as module 102. It may be noted that each disparate module 102, may hold at least one substrate. The modules 102 may be stacked as seen by stacked module 110, of which may include aforementioned module 102. The stacked modules, may also include a top modules, or cap piece 103, of which may include mechanisms and recess, of which allow the substrates and modules, to be removed, as well as act as a plenum for processing gasses, or to keep the interior environment isolated from the ambient.

An example can be that each module, when stacked, seals the environment where the substrate may be held, from the ambient. With the top piece added then the entirety of the stacked modules and substrates are isolated from the ambient, and then additionally, gases or other treatment methods, such as heat, forced air or gas etc. may be introduced to the interior to treat or otherwise clean or store the substrates.

A bottom cap 104 may be used such that the cap provides a structure for the module stack 110 to be mounted or placed on, and also provides for a similar ability of the upper cap to be able to isolate the interior environment from the exterior, such that the substrates and interior of the modules are isolated from the ambient. The bottom cap, may include a nozzle or connector 151, of which may be connected to a gas supply or return, such that the gas may be introduced to the interior environment, wherein the substrates interact or are treated, or aid for any reason by the gas. It may be noted that the gas nozzle 151, may be of any design or plurality, and may be on any side of the lower cap, but also the upper cap, or may be positioned on the side of the module stack. In a preferred embodiment, there may be two nozzles, such that one of the nozzles may be an entry nozzle for the gas and the other may be a return or waste nozzle. It may be also noted that the nozzles may bring in any gas, or other product, such a liquid, for any reason, and that the nozzles may be connected to other machine, or devices of which may treat, pressurize, or provide the gas or other products, and may be in any location.

Isolator or membrane 121 may provide then isolation and separation between the stacked substrates, or stack of substrates such that each individual substrate, stack of substrates or group of substrates may be isolated from one another, the exterior, such as from contamination or breakage. Thus, coupled with top cap 103, and bottom cap 104 along with the carriers, each substrate, or a group of substrate along with the membranes 121 between each, or some, may then isolate the substrates from contamination and direct air or gas within the structure for a function.

Additionally isolator or membrane 121 may provide a channel wherein the air flow may be directed to each individual substrate, stack of substrate, or group of substrates such that a laminar flow either on the individual substrate stack or group is realized. It is noted that the airflow for instance can originate or terminate at air nozzles such as air nozzles 151 after bring flowed through the carrier or stack, such a being guided or directed by the membranes such that the air is laminar.

Figure 2:
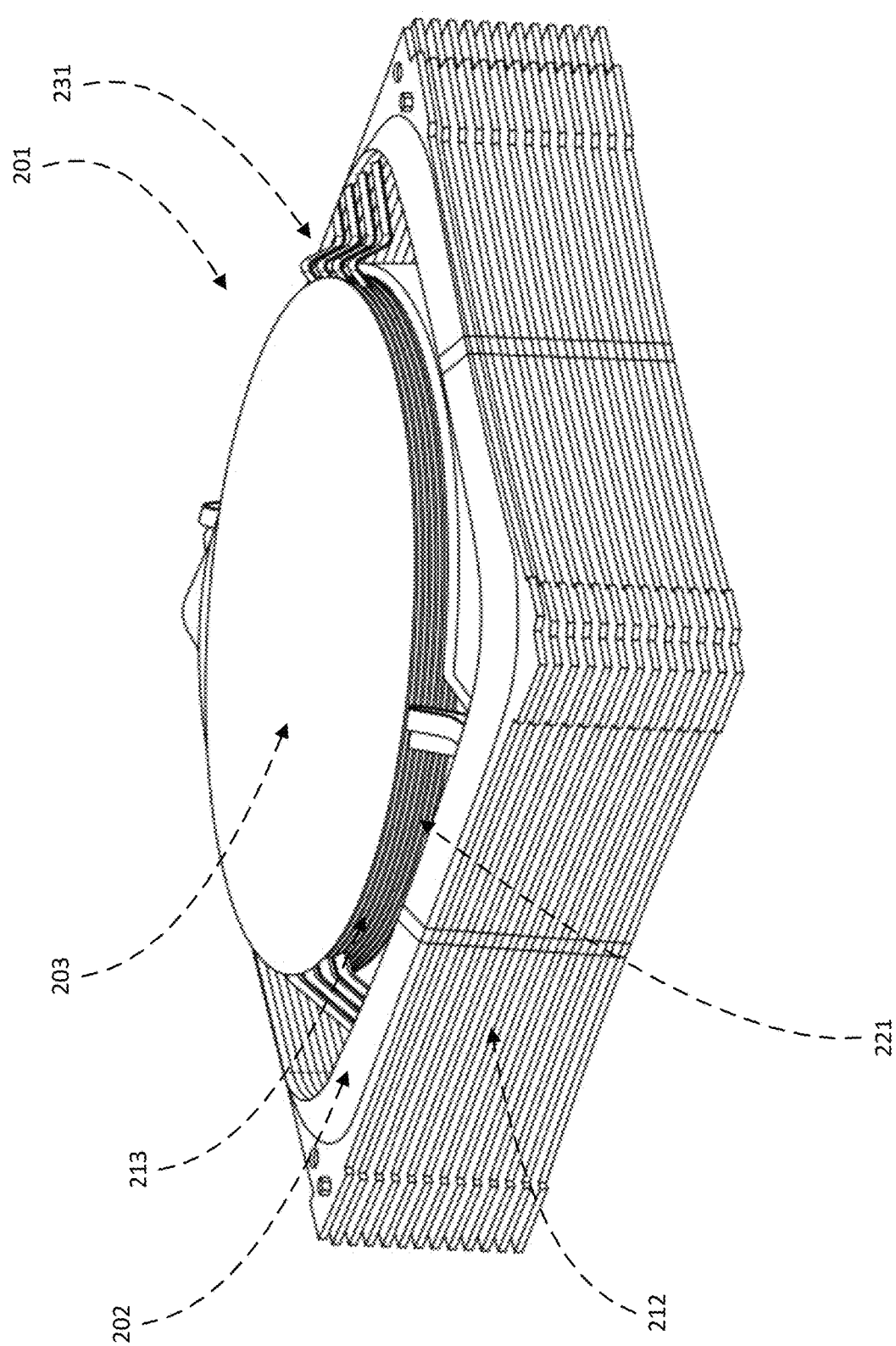
FIG. 2 may be a perspective view one embodiment of the present invention substrate holder with multiple modules with the upper cap removed.

FIG. 2 may be a perspective view one embodiment of the present invention substrate holder with multiple modules with the upper cap removed.

FIG. 2 teaches to a substrate holder 201 of which may have disparate modules 202 stacked, such as stacked modules 212. Each module may have a substrate, such as module 202 having a corresponding substrate 203, of which may be held by the substrates arm 231. It may be then noted that the stack of modules 212 includes stack of substrates 213, where each disparate module holds an individual substrate, via substrate holding arms. This may be exampled by the individual disparate module 202 holding the substrate 203, and then the stack of modules 212 holding stack of substrates 213. It may be noted that any plurality of substrates may be held, and in some embodiments there may be empty modules in the stack, wherein the module does not hold a substrate. It may be also noted that the modules may have any number or plurality of arms, and that the arms may be of any design. Also noted may be that the modules holding individual substrates may be designed as aforementioned and as pictured wherein each individual holder may be such that the stacked substrates and modules may be separated wherein they do not touch such that contamination may be limited.

Isolator or membrane 221 may provide then isolation and separation between the stacked substrates, or stack of substrates such that each individual substrate, stack of substrates or group of substrates may be isolated from contamination sources such as from each other or broken substrates, etc.

Additionally isolator or membrane 221 may provide a channel wherein the air flow may be directed to each individual substrate, stack of substrate, or group of substrates such that a laminar flow either on the individual substrate stack or group is realized wherein between each substrate and individual carrier or holder is a membrane, or wherein only between some substrates and carriers is a membrane.

Figure 3A:
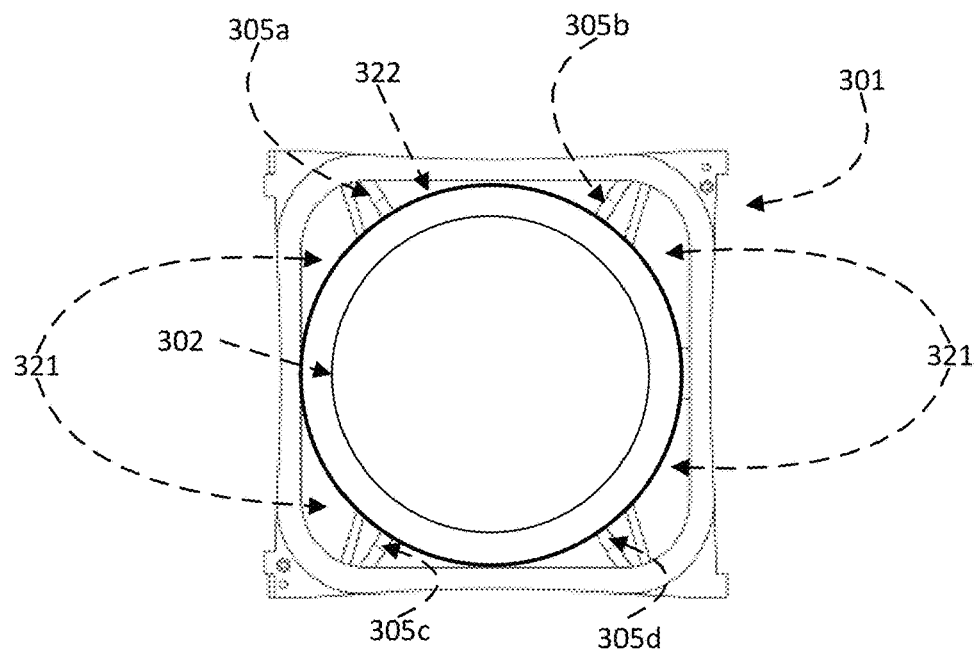
FIG. 3A provides a top down view of an embodiment of the present invention substrate stack and carrier with membrane or isolator.

FIG. 3A provides a top down view of an embodiment of the present invention substrate stack and carrier with membrane or isolator.

FIG. 3A teaches to a substrate module 301, of which may hold a substrate 302. The substrate 302 may be positioned on arms 305a, 305b, 305c and 305d. It may be noted that in other embodiments there may be any other plurality of arms, in any location.

In addition, FIG. 3A shows a top down view of the purge gas distribution channels 321, of which one side may be a supply and one side may be a removal or collector or may be diagonally opposite, among any other designs or combination. It may be noted that the channels may be of any plurality, any size and design as shown, or as one skilled in the art would foresee. In addition, the channels may aid in distributing gas to the substrates in any fashion, such that the air may be provided to each substrate in a laminar fashion such as in FIG. 8B.

Figure 3B:
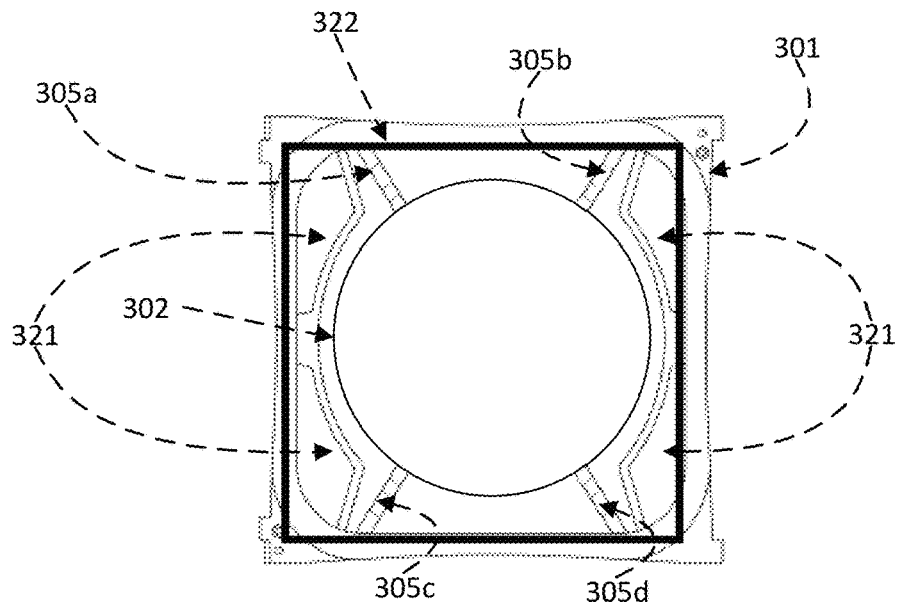
FIG. 3B provides a top down view of an embodiment of the present invention substrate stack and carrier with membrane or isolator.

It is additionally noted that the membrane 322 may in the embodiment shown in FIG. 3B provide to be slightly larger than the substrate, but smaller than the total footprint of the substrate and carrier, and particularly the air channels 321, such that each substrate and carrier space is not fully isolated from the one above below or adjacent and such that debris may fall onto the membrane to reduce contamination of other substrates and areas. It is noted that this allows for air to travel via the ducts and recesses 322 to each substrate wherein the membrane does not interfere. It is noted that the membrane may be small or the same size as the substrate in some embodiments, such as to limit debris and contamination from traveling.

FIG. 3B provides a top down view of an embodiment of the present invention substrate stack and carrier with membrane or isolator.

FIG. 3B teaches to a substrate module 301, of which may hold a substrate 302. The substrate 302 may be positioned on arms 305a, 305b, 305c and 305d. It may be noted that in other embodiments there may be any other plurality of arms, in any location.

In addition, FIG. 3B shows a top down view of the purge gas distribution channels 321, of which one side may be a supply and one side may be a removal or collector or may be diagonally opposite, among any other designs or combination. It may be noted that the channels may be of any plurality, any size and design as shown, or as one skilled in the art would foresee. In addition, the channels may aid in distributing gas to the substrates in any fashion, such that the air may be provided to each substrate in a laminar fashion such as in FIG. 8B.

It is additionally noted that the membrane then membrane 322 may be provided to in the embodiment shown in FIG. 3B to fully isolate than the substrate, such that debris may fall onto the membrane to reduce contamination of other substrates and areas. This then allows that each substrate and carrier space, or groups of carrier spaces that are divided by a membrane are fully isolated between each other, and wherein then air to travel via the ducts and recesses 322 to each substrate either in each group isolated via membranes, or directed by the membranes, such as recesses, ridges or structures on the membranes such that a laminar flow and reduced contamination is realized and. It is noted that the membrane may be small or the same size as the substrate in some embodiments, such as to limit debris and contamination from traveling while still isolating fully, or partially, depending on the structures of the carrier and holder.

Figure 4:
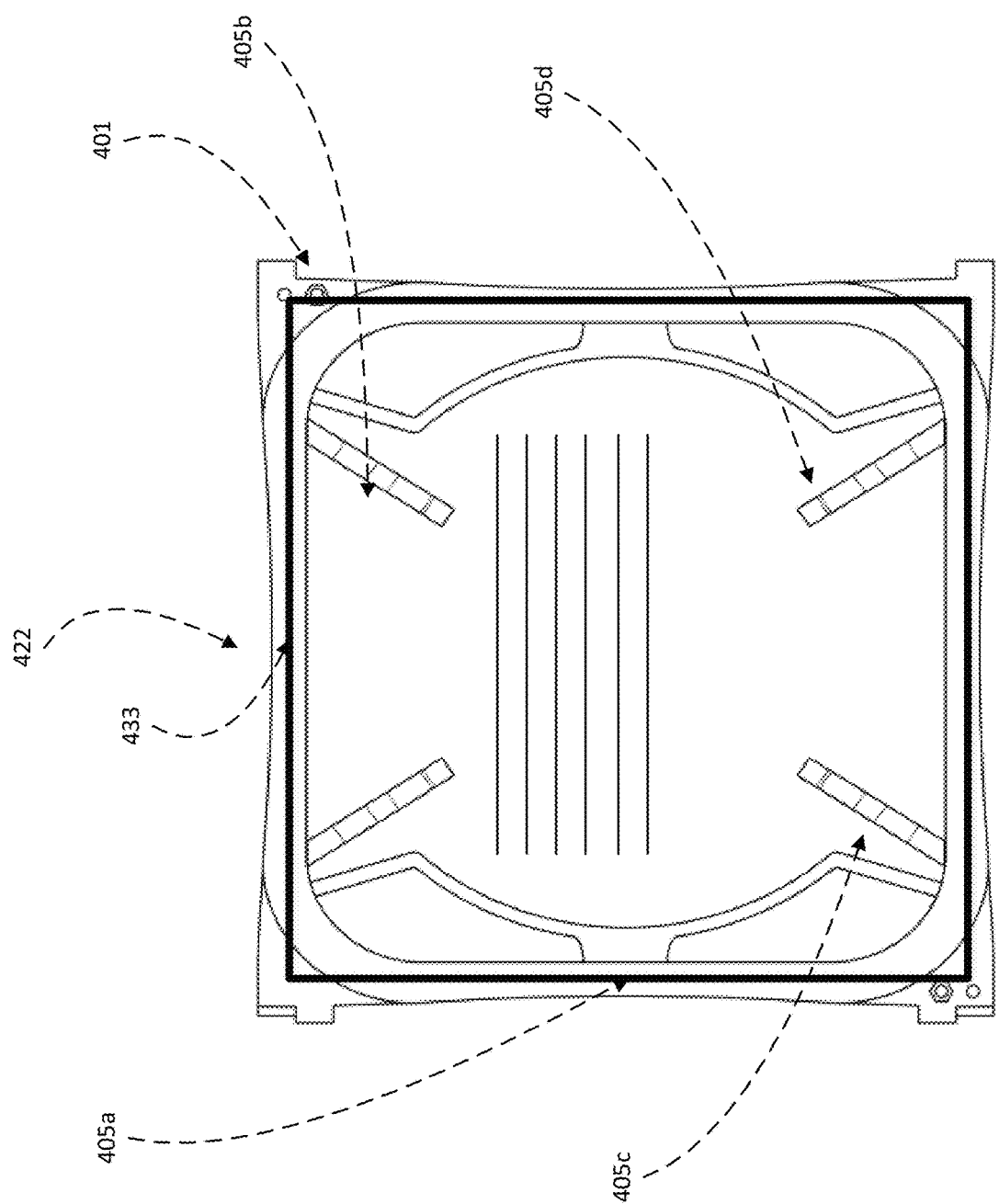
FIG. 4 may be a top down view of one embodiment of the present invention substrate holder individual module without a substrate.

FIG. 4 may be a top down view of one embodiment of the present invention substrate holder individual module without a substrate. It may be noted that may be similar to FIG. 3, but without the substrate.

FIG. 4 teaches to a module 401, with substrate holding arms 405a, 405b, 405c and 405d, of which may extrude into the center of the substrate holder. It may be noted that the length of arms may be of any length. It may be also noted that in a preferred embodiment, the arms may be made in single mold or piece with the holder, such that the length are fixed, but in other embodiments the arms may be adjustable via a hanger or extension. It may be also noted that the length may be determined by the intended substrate size.

It is noted that the membrane 422 may then isolate completely the substrate from the below substrate, such that when the carriers or modules are stacked, each substrate is isolated. It is noted that ridges or other structures 433 may aid in directing the air flow to or over or under the substrate when air is introduced to the volume between the substrate and membrane.

Figure 5:
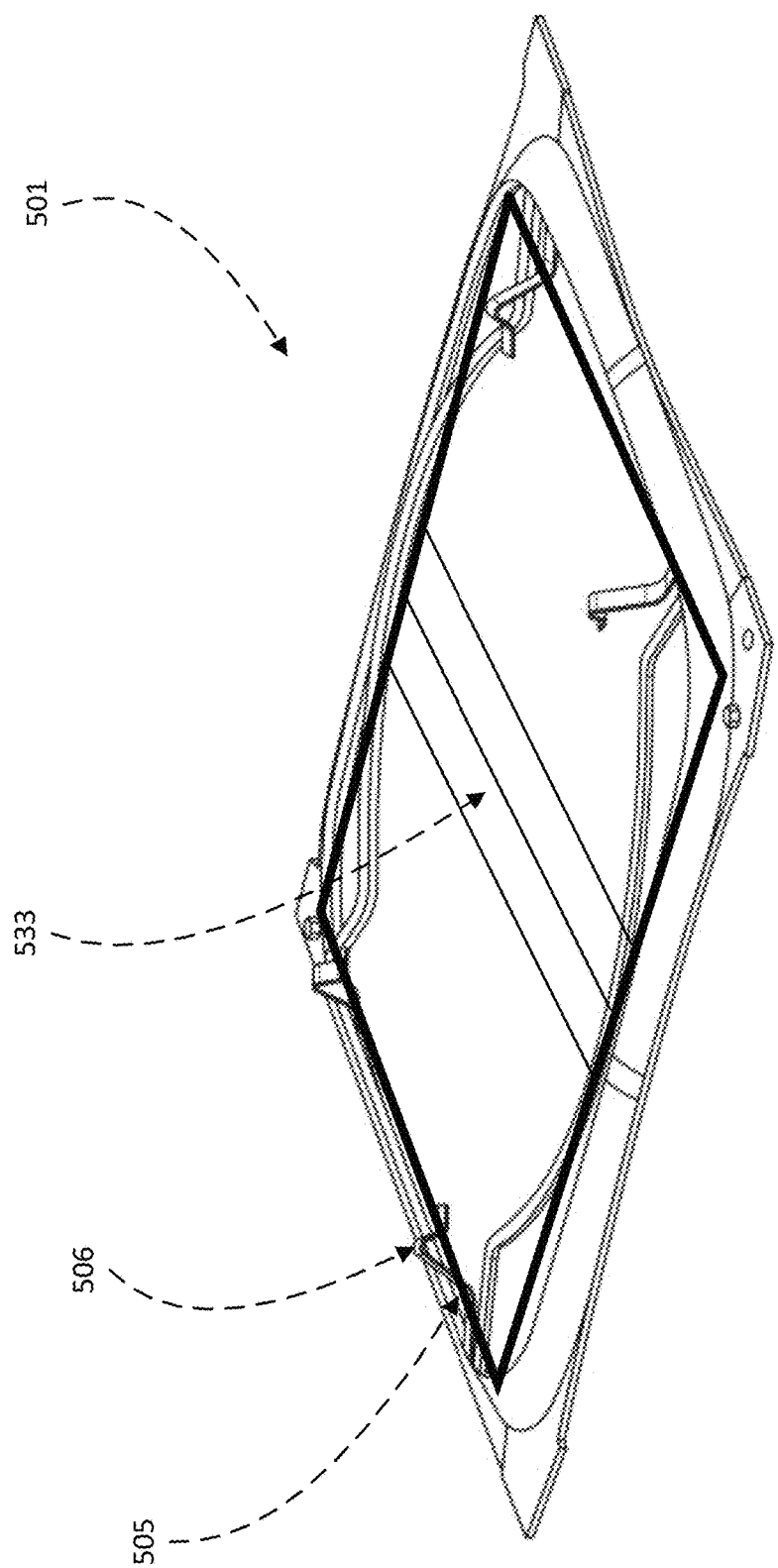
FIG. 5 may be a perspective view of one embodiment of the present invention substrate holder individual module without a substrate.

FIG. 5 may be a perspective view of one embodiment of the present invention substrate holder individual module without a substrate.

FIG. 5 teaches to a substrate holder 501, of which may be noted may be the same as found in FIG. 3 and FIG. 4.

FIG. 5 teaches to the substrate holder having the substrate arms, wherein in the perspective view it may be easily seen the substrate holding arms 505 are present. In the perspective view it can be seen that the arm 505, arches upward at point 506, and include a notch at a higher point than the connection point of the arm to the holder body. It may be noted that the angle, length and degree of the arch and notch in relation to the holder body may be of any characteristic. It may be also noted that when stacked, the above or below holder and substrate, than via the arm, may be offset from the substrate below, such that the substrates do not touch, or contaminate each other, and such that a small distance, such as 0.5 mm may be held between the substrate. It may be also noted that the arches allow for the substantial weight of the stack to be transferred between holder body to holder body, and not through the substrates or arms themselves. Additionally the arm 505 may then provide wherein the substrate sits higher than the membrane within or associated with the present carrier 501, such that the substrate does not touch the membrane.

Additionally, the membrane may provide wherein the membrane includes air channels, recesses or structures 533 which may guide air over the substrate below or above such that the air flow is laminar or to reduce contamination and for a function or to direct air in a particular direction or such as to change velocity or pressure.

Figure 6A:
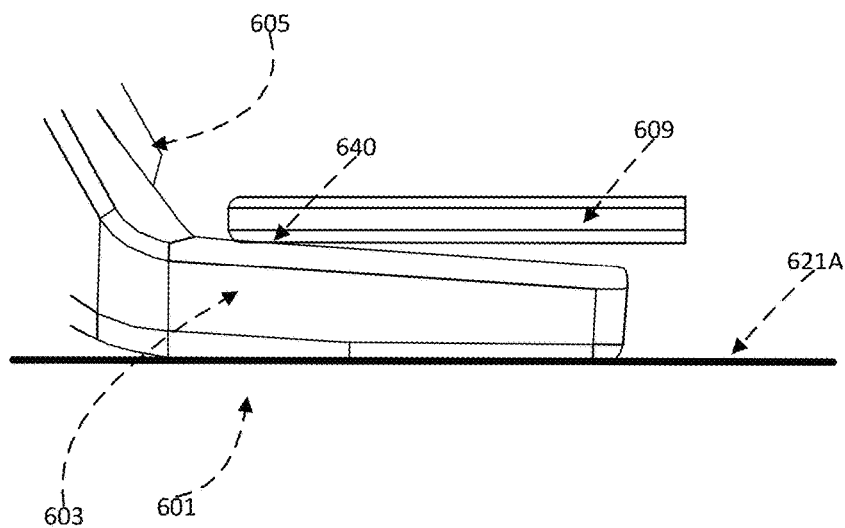
FIG. 6A may be a close up side sectional view of one embodiment of the present invention substrate holder's substrate holding arm with a substrate present.
Figure 6B:
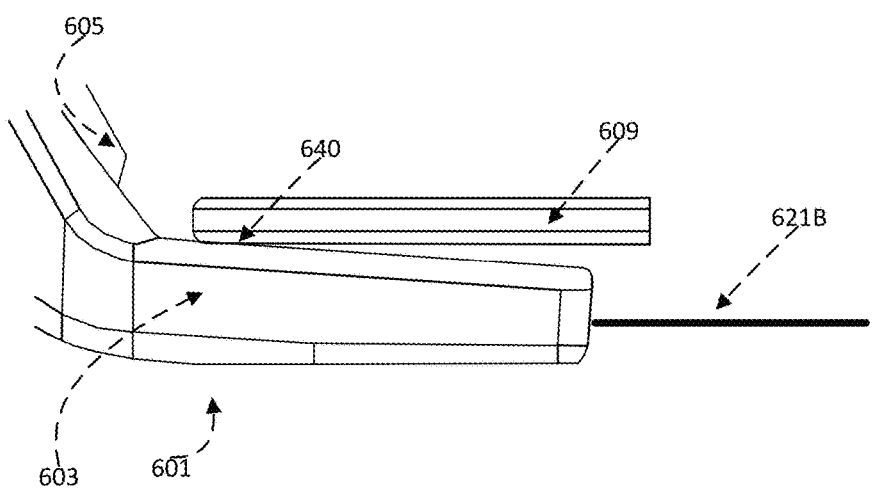
FIG. 6B may be a close up side sectional view of one embodiment of the present invention substrate holder's substrate holding arm with a substrate present.
Figure 6C:
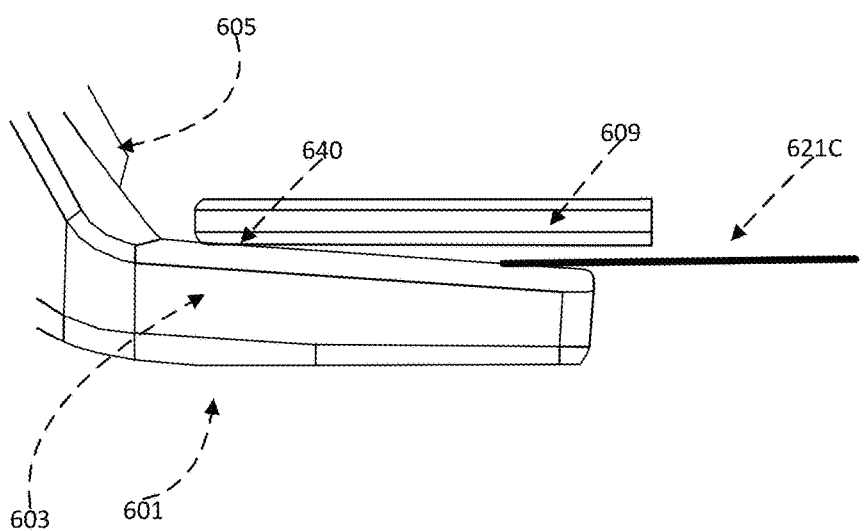
FIG. 6C may be a close up side sectional view of one embodiment of the present invention substrate holder's substrate holding arm with a substrate present.

FIGS. 6A, 6B and 6C may be a close up side sectional view of one embodiment of the present invention substrate holder's substrate holding arm with a substrate present.

FIG. 6A teaches to the substrate holder arm 601, wherein a substrate 609 may be held. It may be noted that the notch 603, of which the substrate may be directly in contact with may be angled downward in respect to the rest of the arm 601 structure, as well as the substrate. This makes the contact point 640, the smallest possible, reducing chafing, contamination on the substrate, and allows the contact patch 640 to be at the furthest edge of the substrate, such that the substrate's surface may be able to be or may be not likely to be contaminated or in contact with the substrate arm at any other point. It may be also noted that the slot extrusion 605 may be pictured of which extrudes from them main arm structure, such that if the substrate may be moved, jostled or inadvertently removed, the notch will need the substrates ability to fall or otherwise be dispositioned from the substrate holding arms.

Membrane 621A may be structure, attached or formed such that the membrane is provided to be under the carrier arm 603, wherein then the membrane isolates the above and below substrate, such as shown substrate 609 on their respective carriers such as carrier 601. It is noted that the membrane may be provided to extend past the arm, such as to be formed past the arm to continuing to the side of the carrier as shown or may terminate under arm 603, which is not shown FIG. 6B teaches to the same substrate carrier as FIG. 6A with similar features. FIG. 6B however provides membrane 621B.

Membrane 621B may be structure, attached or formed such that the membrane is provided to be on a proximal side of the carrier arm 603, wherein then the membrane isolates the above and below substrate, such as shown substrate 609 on their respective carriers such as carrier 601. It is noted that the membrane may be provided to extend past the arm, such as to be formed past the arm to continuing to the side of the carrier not shown or may terminate at the arm 603 as shown.

FIG. 6C teaches to the same substrate carrier as FIG. 6A with similar features. FIG. 6C however provides membrane 621C Membrane 621C may be structured, attached or formed such that the membrane is provided to be on the top side of carrier arm 603, wherein then the membrane isolates the above and below substrate, such as shown substrate 609 on their respective carriers such as carrier 601. It is noted that the membrane may be provided to extend past the arm, such as to be formed past the arm to continuing to the side of the carrier not shown or may terminate at the arm 603 as shown.

Figure 7:
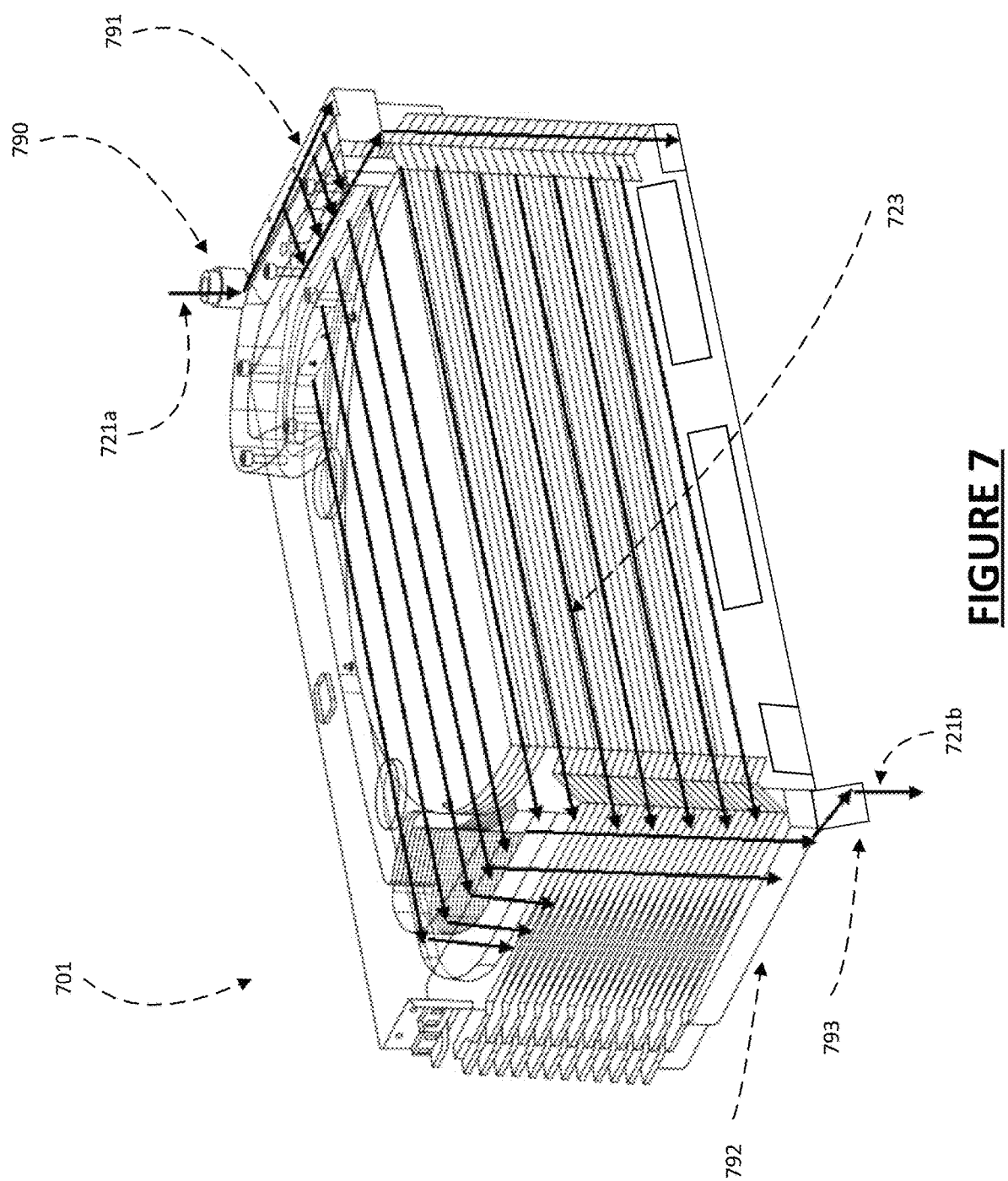
FIG. 7 a perspective cross section view of an embodiment which may provide example gas flow diagram.

FIG. 7 is a perspective cross section view of an embodiment which may provide example gas flow diagram.

FIG. 7 provides wherein gas 721a may enter into inlet 790, and then enter into gas distribution channels 791, which then may be distribution in a latitude and longitude direction across the side gas flow buffer panel, of which may in other embodiments, may be on any side. The gas flow may then permeate and travel throughout the present invention, and provide for a laminar and even flow across the products or substrates and modules as aforementioned, to interact with the product and to perform a function such as cleaning processing etc. The gas flow may then enter the gas flow exiting recess 792, where then the gas flow may be pushed into the gas outlet 793 and may exit the present invention as gas 721b. The gas 721b may be then contaminated and further processed, released, reused and recycled, etc.

It may be noted that the gas flow, including the associated structures, while specifically stated as a preferred embodiment as shown and disclosed, may also be provided in different structures, shapes or flow directions, as the embodiment sees fit.

It is then provided that membranes 723, not shown, but are appreciably between the wafers, may then provide wherein when the gas flow 721a is moving across, or up and down, or in any direction such to direct the gas flow such to be laminar over a substrate or multiple substrates and may direct the gas flow as such and to an output from an input. Additionally it is noted that the membrane may then isolate air flows to reduce spreading of contamination of the gas flow moves through a volume or contacts a contamination source, such that the gas flow after contacting a contamination source only contacts limited areas downstream before the output.

It is noted that the membranes may isolate both the substrate, carrier and also gas flow, or group of substrate carrier, and gas flows from respectively other substrates, carriers, groups, and flows.

FIGS. 8A, 8B, 8C, 8D and 8E may be profile views of an embodiment of the present invention Tec-Cell with substrate protection methods, devices and systems.

Figure 8A:
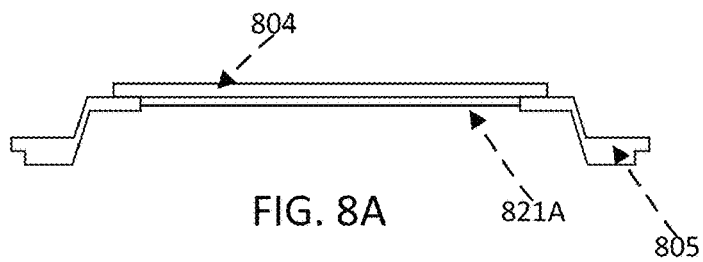
FIG. 8A may be profile views of an embodiment of the present invention Tec-Cell with substrate protection methods, devices and systems.

FIG. 8A teaches to a membrane 810 in the carrier under the substrate with membrane 821A.

Figure 8B:
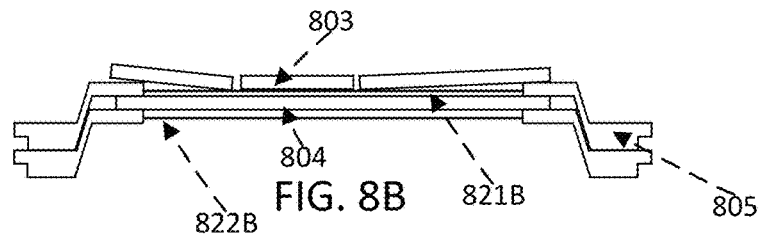
FIG. 8B may be profile views of an embodiment of the present invention Tec-Cell with substrate protection methods, devices and systems.

FIG. 8B teaches to a broken substrate being held by the membrane, wherein the below substrate or substrates may be then not contaminated or damaged by the broken substrate such as via the membrane 821B stopping the contaminated or broken substrate 803 from contacting substrate 804.

Figure 8C:
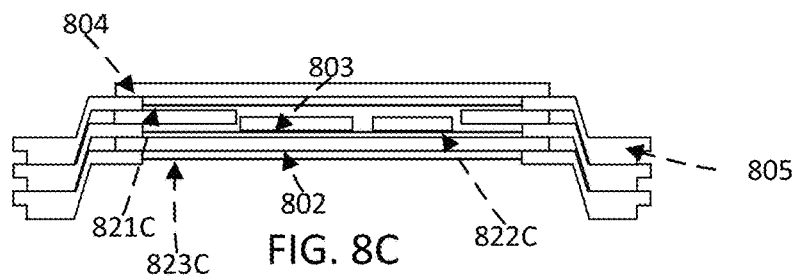
FIG. 8C may be profile views of an embodiment of the present invention Tec-Cell with substrate protection methods, devices and systems.

FIG. 8C teaches to a broken substrate, wherein the substrates below and above may be not damaged or contaminated by the broken substrates, and wherein the carriers may be still able to be stacked when a substrate beaks such as via the membrane 821B stopping the contaminated or broken substrate 803 from contacting substrate 80q, and wherein substrate 804 is isolated via membrane 821C wherein substrate 804 is above the broken substrate 803.

Figure 8D:
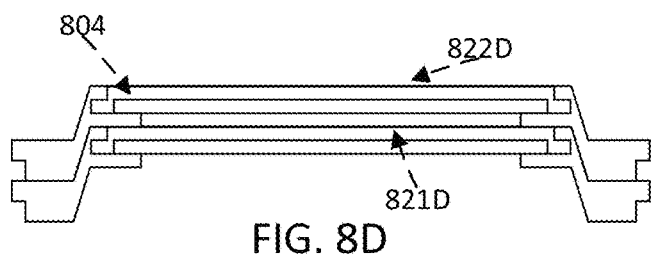
FIG. 8D may be profile views of an embodiment of the present invention Tec-Cell with substrate protection methods, devices and systems.

FIG. 8D teaches to a membrane 810 in the carrier may be above and not below the substrate. It may be noted that in some embodiments, there may be a mixture of membranes on top and below, and as such the membrane and carriers may be designed to be able to stack all of one, all of the other, or a combination of both.

FIG. 8D also teaches wherein the membrane 822D, which is mounted on the upper side of a carrier arm can include an upper and lower membrane to the same arm 805 as seen with upper membrane 822D and lower membrane 821D which isolated carried substrate 804.

It is noted that the double membrane carriers, and single membrane carriers regardless of membrane positioning can be stacked in any order or wherein the system provides a particular order, such as only stacking membranes with upper membranes and lower membranes separately such that the membranes do not interfere or provide wasted isolated space, such as between with no carrier or substrate between, such that isolation and proper stacking is realized.

Figure 8E:
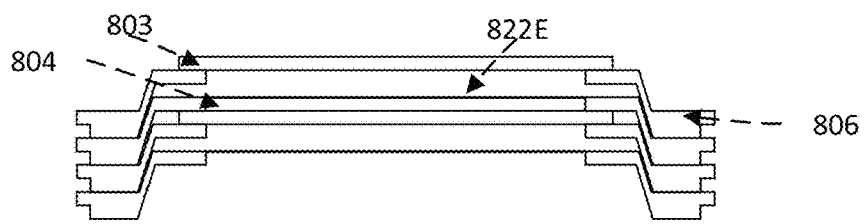
FIG. 8E may be profile views of an embodiment of the present invention Tec-Cell with substrate protection methods, devices and systems.

FIG. 8E teaches to wherein the membrane and substrate may be separate and wherein there may be a special carrier having a membrane only, a carrier for a substrate only. It may be noted the membrane carrier can be thinner than the substrate carriers, such as to take less weight and room wherein the membrane weighs less and may be thinner than a substrate such as to have higher substrate density in a given stack.

FIG. 8E further provides wherein a carrier 806 may be provided wherein instead of carrying a substrate, the carrier carries a membrane 822E wherein the membrane 822E can provide isolation for instance between substrate 803 and substrate 804 for instance.

Figure 9A:
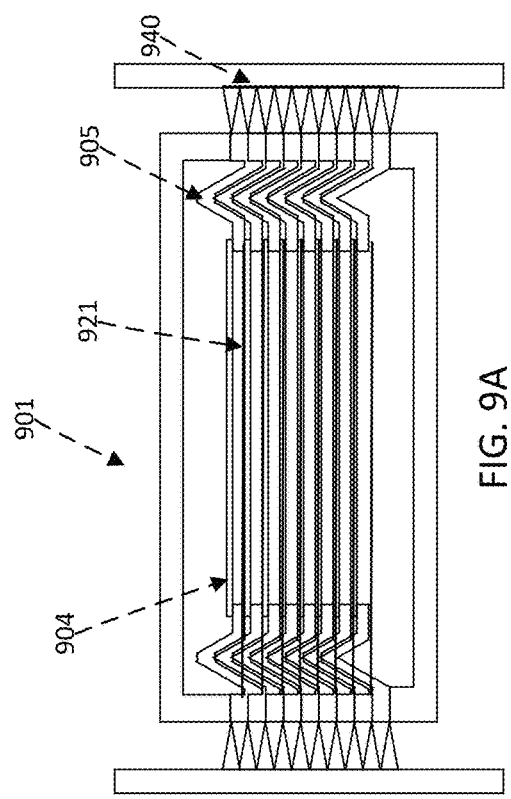
FIG. 9A provide an embodiment wherein the present invention is in a high density and low density state with membrane isolation.
Figure 9B:
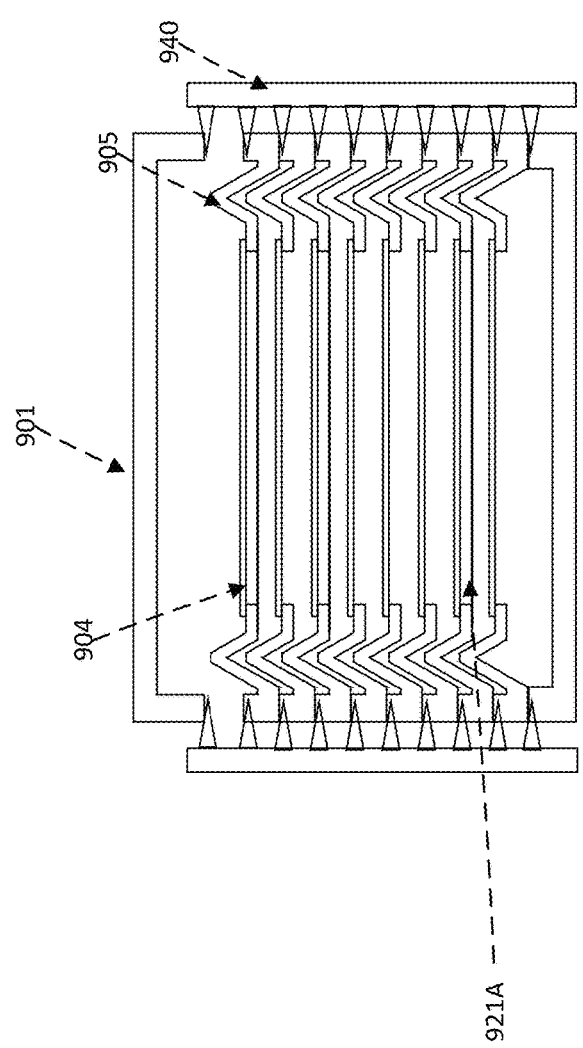
FIG. 9B provide an embodiment wherein the present invention is in a high density and low density state with membrane isolation.

FIGS. 9A and 9B provide an embodiment wherein the present invention is in a high density and low density state with membrane isolation.

FIG. 9A describes an opener station in the closed position wherein a stack of Tec-Cell may be placed in the opener station and the separation 950 of the wafers may be minimal (order of 1-5 mm), for example, by separators 970 having pins at the same separation 960.

It is noted that the membrane 921 may be provided between the substrates and carriers in a high density state, wherein the membranes are able to be positioned between an adjacent, carrier, substrate and membrane, or groups, wherein then isolation is kept.

FIG. 9B describes an opener station in the separated position wherein the Tec-Cells may be separated and wherein the separation 955 of the wafers may allow for robot to pick up. The increase in separation can be caused by separators 970 having pins at the higher separation 965.

It may be noted that the pins and separators may be of any design or type and that there may be different opener configurations such as all wafers may be separated at the same distance or the separation distance may be varied, or that some wafers and carriers may be separate and some may not.

It is noted that the membrane 921 may be provided between the substrates and carriers in a low density state.

FIG. 10A is a flow chart diagram of an embodiment of the present invention membrane within a carrier or holder.

FIG. 10A provides at least process 1000 wherein providing a membrane or membranes between substrates or carriers or a group of substrates FIG. 10B is a flow chart diagram of an embodiment of the present invention membrane within a carrier or holder.

FIG. 10B provides at least process 1001 wherein providing a membrane or membranes between substrates or carriers or a group of substrates in an insert or recess in the carrier or holder, process 1002 wherein wherein a robot is able to remove the membrane and deliver the membrane to a cleaning or disposal station and process 1003 wherein replacing or returning a membrane to the membrane insert or recess in the carrier or holder.

Figure 11:
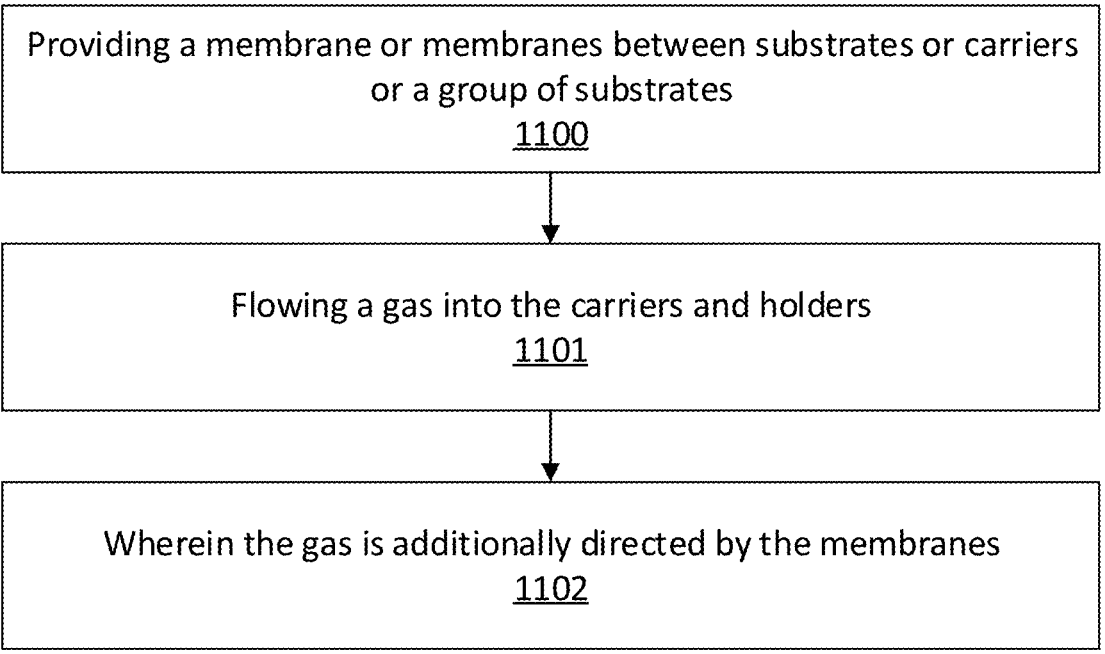
FIG. 11 is a flow chart diagram of an embodiment of the present invention membrane within a carrier or holder with air flow.

FIG. 11 is a flow chart diagram of an embodiment of the present invention membrane within a carrier or holder with air flow.

FIG. 11 provides at least process 1100 wherein providing a membrane or membranes between substrates or carriers or a group of substrates, process 1101 wherein flowing a gas into the carriers and holders and process 1102 wherein the gas is additionally directed by the membranes.

It is noted that the substrates or wafers throughout this disclosure may be a product wafer or substrate, such as an incomplete or complete semiconductor device or element, or a processing substrate such as a reticle or any other processing element which may be transported, handled, held or stored such as a reticle substrate, of which may be any type including photomasks for photolithography, EUV, or any other type. It is noted that the substrate, whether product or processing may be provided different features and elements described depending on the type, and may be in any permeation or combination of the elements and features mentioned. It is also noted that the substrates, such as a reticle or processing elements may be captive in their own container, or may be bare in the larger containers, carriers and features and elements described. For instance a reticle substrate may be handled directly by the machinery and structures described herein or the reticle may be housed an integral or removable housing, wherein the housing and reticle together, or separately are handled by the machinery and structures described herein.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It may be appreciated that the various systems, methods, and apparatus disclosed herein may be embodied in a machine-readable medium and/or a machine accessible medium compatible with a data processing system (e.g., a computer system) and of which may be in any form including transitory, non-transitory or persistent data systems, as well as may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A substrate manufacturing, storage, processing or transfer system comprising:
a substrate handling system including one or more holders; wherein
the one or more holders:
are stackable,
include one or more holding arms that extend into a center interior recess of the holder such that the holder holds a substrate via the one or more holding arms,
hold one substrate each, such that there is a separation between each substrate when the one or more holders are stacked,
are each integrally formed from one unitary piece, and include one or more isolation structures, wherein a holder and a held substrate are isolated from a different holder and a different held substrate which are above or below the holder and the held substrate in a stack.

2. A system as in claim 1, wherein
the one or more isolation structures reduce contamination between disparate stacked holders and substrates.

3. A system as in claim 1, wherein
the one or more isolation structures impede contamination from broken or chaffing substrates or holders.

4. A system as in claim 1, wherein
the one or more isolation structures are a membrane, wherein the membrane is permeable to gas, but not to debris or dust.

5. A system as in claim 1, wherein
the one or more isolation structures include guides, wherein the guides guide a gas such that the gas is provided to the substrates in a laminar flow.

6. A system as in claim 1, wherein
the one or more isolation structures include guides, wherein the guides guide a gas such that the gas is directed from one or more gas inlets in the holder, over the substrates in a laminar flow, to one or more other gas outlets in the holder.

7. A system as in claim 1, wherein
the one or more isolation structures are made in the same production step as the corresponding one or more holders.

8. A system as in claim 1, wherein
the one or more isolation structures are made of the same material as the corresponding one or more holders.

9. A system as in claim 1, wherein
the substrates held by the one or more holders are not clamped or have pressure exerted onto the substrates by the one or more holders.

10. A system as in claim 1, wherein
the one or more holders are square-shaped; and
the one or more holding arms include four arms, having one arm on each diagonal side of the one or more holders.

11. A system as in claim 1, wherein
the one or more holding arms have an angled arch design with a notch on the inward side of the arch, wherein the notch angles downward in relation to the substrate.

12. A system as in claim 11, wherein
the one or more holding arms position a contact patch between the one or more holding arms and the substrate on the extreme end of the substrate.

13. A system as in claim 1, wherein
the one or more isolation structures include an isolation structure that fully spans the interior space of the holder, such that all of the area immediately below the substrate being held is isolated from a volume below.

14. A system as in claim 1, wherein
the one or more isolation structures include an isolation structure that only partially spans the interior space of the holder, such that most of the area immediately below the substrate being held is isolated from a volume below.

15. A system as in claim 1, wherein
the one or more isolation structures include an isolation structure that is configured in a plane with a bottom edge of the holder, such that the isolation structure spans the interior of the holder, below the substrate held by the holder, but above a corresponding substrate and holder below when stacked.

16. A system as in claim 11, wherein:

the one or more isolation structures include an isolation structure that is configured in a plane with a bottom edge of the holder arm, such that the isolation structure spans the entire interior of the holder, below the substrate held by the holder, but above a corresponding substrate and holder below when stacked.

17. A substrate manufacturing, storage, processing or transfer system comprising:

a substrate handling system including one or more holders; wherein the one or more holders:
- are stackable,
- include one or more holding arms that extend into a center interior recess of the holder such that the holder holds a substrate via the one or more holding arms,
- hold one substrate each, such that there is a separation between each substrate when the one or more holders are stacked,
- are each formed from one piece,
- include one or more isolation structures, wherein a holder and a held substrate are isolated from a different holder and a different held substrate which are above or below the holder and the held substrate in a stack;

the one or more holding arms have an angled arch design with a notch on the inward side of the arch, wherein the notch angles downward in relation to the substrate; and the one or more isolation structures include an isolation structure that is configured in a plane with a bottom edge of the holder arm, such that the isolation structure spans the interior space of the arms, such that the isolation structure is below only the substrate, and arms being held, and above a corresponding substrate and holder below when stacked.

18. A system as in claim 11, wherein:

the one or more isolation structures include an isolation structure that is configured in a plane along the interior edge of the holder arm, such that the isolation structure spans the interior space of the arms, such that the isolation structure is below only the substrate, and arms being held, and above a corresponding substrate and holder below when stacked.

19. A system as in claim 11, wherein:

the one or more isolation structures include an isolation structure that is configured in a plane on the top edge of the holder arm, such that the isolation structure spans the interior space of the arms, such that the isolation structure is below only the substrate, and arms being held, and above a corresponding substrate and holder below when stacked.

20. A system as in claim 19, wherein:

the one or more isolation structures include an isolation structure that is configured such that the contact point of the substrate to the holder is above the isolation structure, such that the isolation structure and substrate do not touch.

\* \* \* \* \*